(12) United States Patent
Shimizu

(10) Patent No.: US 8,023,272 B2
(45) Date of Patent: Sep. 20, 2011

(54) ELECTRONIC COMPONENT HOUSING UNIT

(75) Inventor: Tomohiko Shimizu, Makinohara (JP)

(73) Assignee: Yazaki Corporation, Tokyo (JP)

( * ) Notice: Subject to any disclaimer, the term of this patent is extended or adjusted under 35 U.S.C. 154(b) by 641 days.

(21) Appl. No.: 12/134,300

(22) Filed: Jun. 6, 2008

(65) Prior Publication Data

US 2008/0304211 A1    Dec. 11, 2008

(30) Foreign Application Priority Data

Jun. 7, 2007    (JP) ................. 2007-151446

(51) Int. Cl.
*H02B 1/00*    (2006.01)

(52) U.S. Cl. .......................... 361/752; 439/92

(58) Field of Classification Search .................. 361/730, 361/752, 790, 797, 800, 683; 439/95, 92, 439/96, 101, 108

See application file for complete search history.

(56) References Cited

U.S. PATENT DOCUMENTS

| | | | | |
|---|---|---|---|---|
| 4,413,871 A | * | 11/1983 | Swengel, Jr. | 439/92 |
| 5,419,709 A | * | 5/1995 | Onoda | 439/95 |
| 6,929,514 B1 | * | 8/2005 | Chuang | 439/652 |
| 7,170,002 B2 | * | 1/2007 | Thompson | 174/51 |

FOREIGN PATENT DOCUMENTS

JP    2006-109587 A    4/2006

* cited by examiner

*Primary Examiner* — Lisa Lea Edmonds
*Assistant Examiner* — Xanthia C Cunningham
(74) *Attorney, Agent, or Firm* — Sughrue Mion, PLLC

(57) ABSTRACT

To perform the temporary mounting of an electronic component housing unit, a clamp is inserted into a clamp hole formed in the load bearing face of a vehicle body. Then, a screw through hole in a grounding terminal is aligned with a screw hole formed in the load bearing face, and a screw is inserted therein and tightened to secure the earth portion of the grounding terminal to the load bearing face. At this time, rotational torque generated by tightening the screw is absorbed by the clamp that is directly fixed to the grounding terminal. Since the clamp is fixed directly to the grounding terminal, turning of the electronic component housing unit bearing the grounding terminal can be prevented, without stress being transmitted to a case and to other constituents.

5 Claims, 5 Drawing Sheets

ELECTRONIC COMPONENT HOUSING UNIT

BACKGROUND OF THE INVENTION

1. Field of the Invention

The present invention relates to an electronic component housing unit that accommodates an electronic component within a case, and that is clamped around and secured to the intermediate portion of a length of an electric wire.

2. Description of the Related Art

A problem encountered with such housing units is that certain of a variety of sensors mounted on an automotive may intermittently receive, along an electric wire or wires, conduction noise produced by a device such as a horn or a wiper motor, which generates noise having a high frequency element, or external noise, generated by neon signs, or induction noise, and this noise can cause a device to operate erratically. Conventionally, a technique for the removal of noise has been proposed that involves the employment of an electronic component housing unit (a noise prevention device), as disclosed in patent document 1.

Patent Document 1: JP-A-2006-109587

An automotive installation problem, which can adversely affect the operation of an electronic component accommodated within a conventional electronic component housing unit, is that when the electronic component housing unit is mounted on a vehicle, concentrated stress is applied to, and can deform, the unit.

Specifically, an electronic component housing unit, which accommodates, in an incorporated case, an electronic component, is intended to be clamped around and secured to the intermediate portion of a length of electric wire. To complete mounting of such a housing unit on a vehicle, first, a resin fitting portion is inserted into a through hole and temporarily fixed to a metal, load bearing face on which the housing unit is to be mounted. Then, a screw is used to securely attach a grounding terminal lead to the metal, load bearing face. During this final mounting operation, when the screw is rotated to tighten the grounding terminal lead, the housing unit bearing the grounding terminal may also turned by a torque applied by an impact wrench. The resin fitting portion, however, is used to impede such movement. Therefore, the resin fitting portion is not only employed for temporal tacking but also for preventing rotation, and for this purpose is integrally formed with a cover that engages the case of the electronic component housing unit. However, if excessive driving force is applied while the screw is being tightened, this excessive force is also applied to the resin fitting portion that, in effect, connects the cover to the case. As a result, when the cumulative stress applied to such a relatively weak portion becomes too great, deformation can occur.

While taking the above described situations into account, one objective of the present invention is to provide an electronic component housing unit that can prevent deformation due to screw tightening torque.

In order to achieve this objective, according to a first aspect of the invention, provided is An electronic component housing unit comprising a case accommodating an electronic component and at least a part of an electric wire, a grounding terminal including a base portion provided so as to be engaged with the case, an earth portion continued from the based portion and to be attached to an external object on which the electronic component housing unit is to be mounted, and a fitting portion to be fitted to the external object, wherein the fitting portion is secured to the base portion.

According to this aspect of the invention, since the fitting portion is coupled with the grounding terminal, the fitting portion can absorb the rotation torque generated while a screw is being driven and impede the turning of the electronic component housing unit bearing the grounding terminal, without stress being transmitted, for example, to the case of the housing unit. As a result, the occurrence of deformation can be avoided. Furthermore, according to this invention, since the fitting portion is connected to the grounding terminal, the area of the load bearing surface employed as the mounting portion can be reduced.

According to a second aspect of the invention, for the electronic component housing unit of the first aspect, the base portion of the grounding terminal is formed so as to serve a cover for the electronic component accommodated in the case.

According to this aspect of the invention, the grounding terminal is made of metal, and the case wherein the electronic component is accommodated is covered by the base of the grounding terminal. Therefore, a structure is provided that is difficult to deform.

According to the first aspect of the invention, deformation due to screw tightening torque can be prevented, and the area of a load bearing surface required for a mounting portion can be reduced.

According to the second aspect of the invention, the rigidity of the electronic component housing unit can be increased to provide a structure that is resistant to deformation.

DESCRIPTION OF THE PREFERRED EMBODIMENTS

Figure 1:
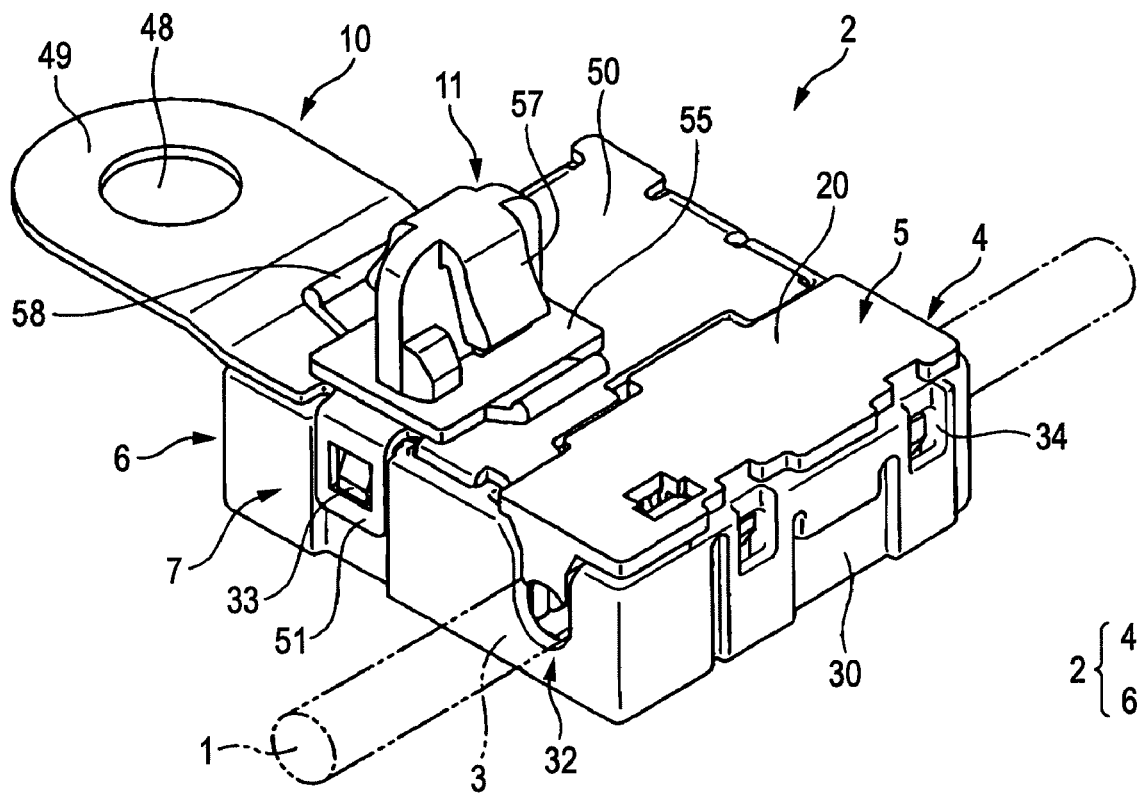
FIG. 1 is a perspective view of an electronic component housing unit according to one embodiment of the present invention.
Figure 2:
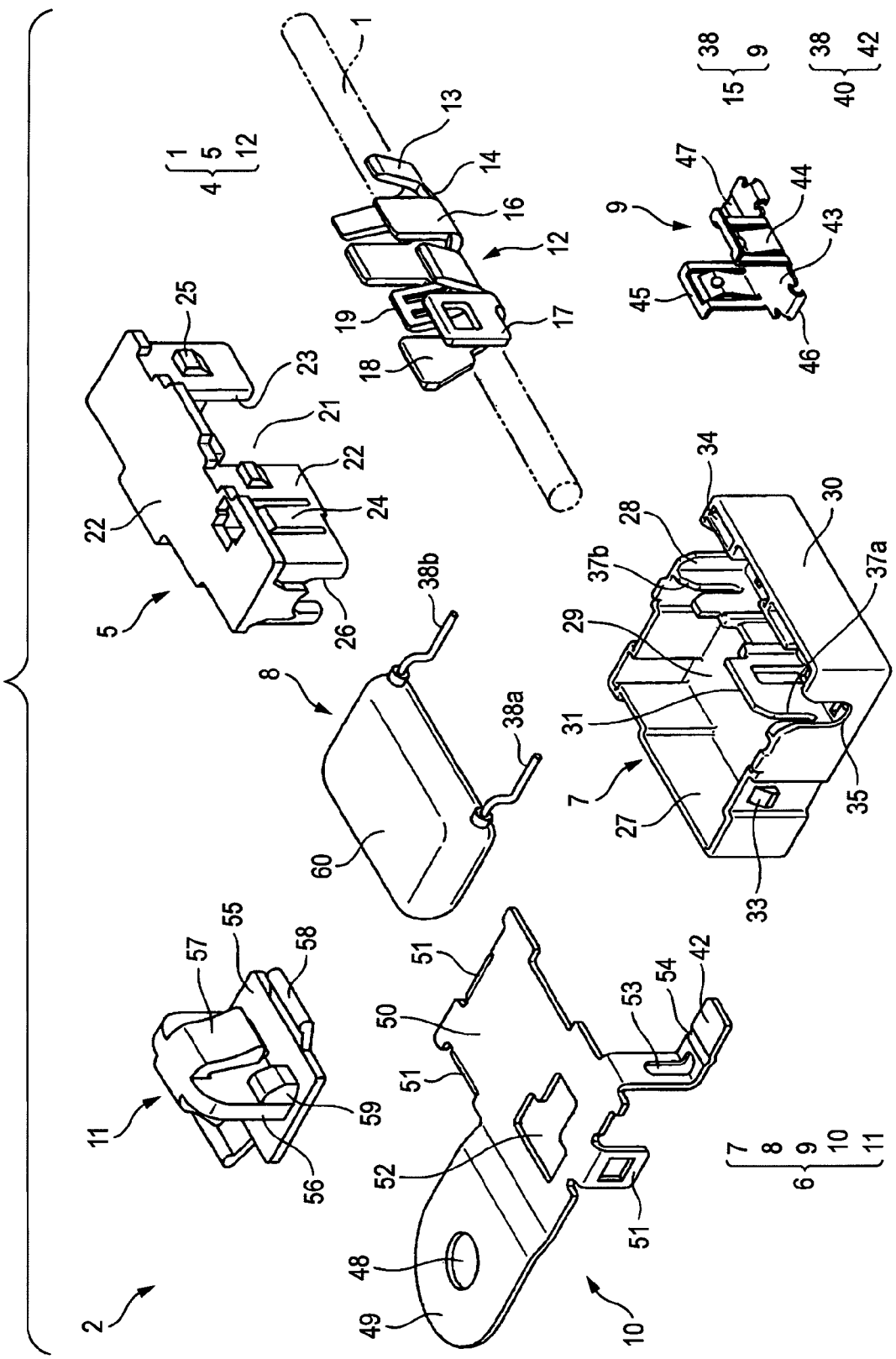
FIG. 2 is an exploded perspective view of the structure of the electronic component housing unit.
Figure 3:
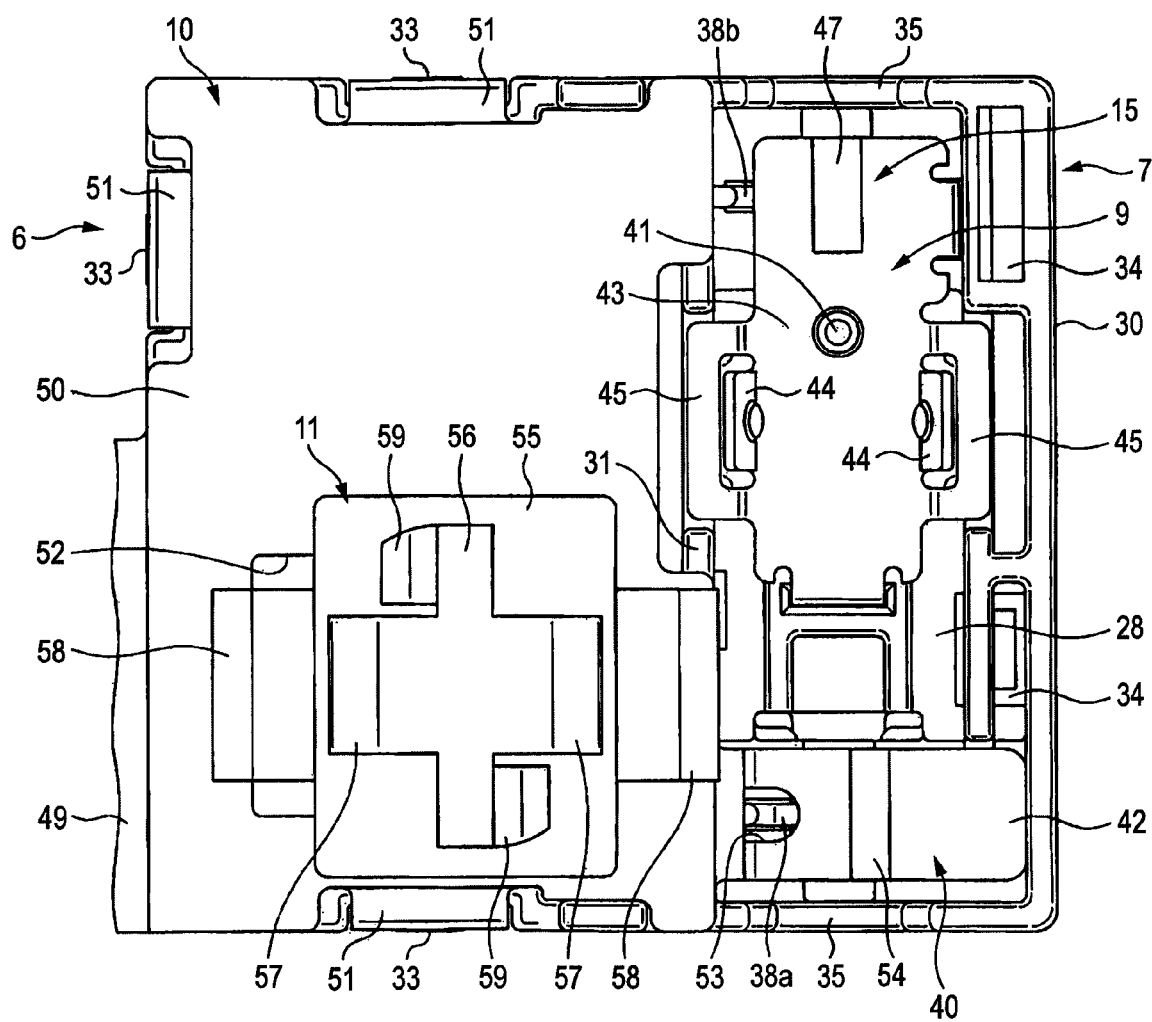
FIG. 3 is a plan view of the wire passing portion of the electronic component housing unit.
Figure 4:
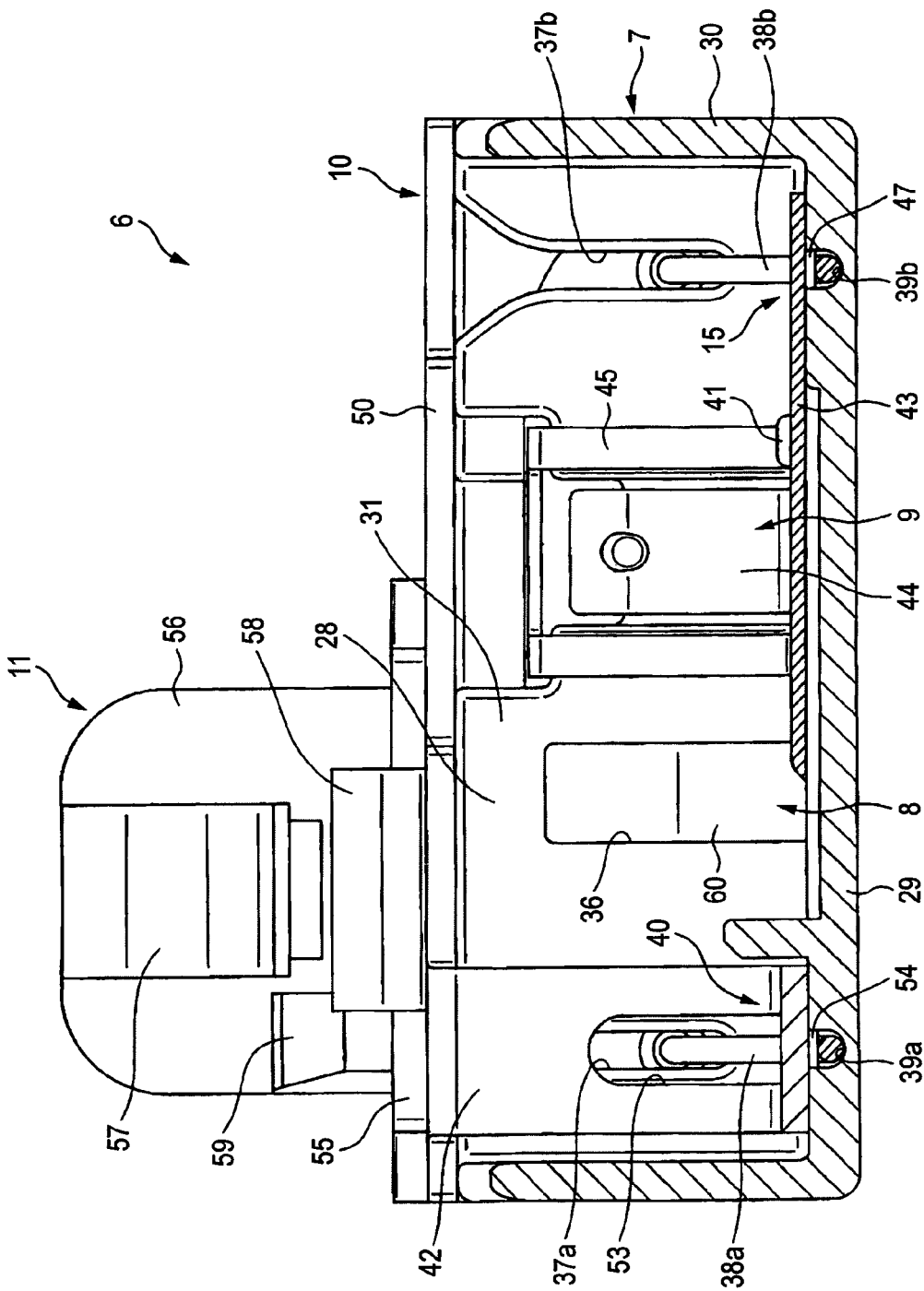
FIG. 4 is a cross sectional view of the wire passing portion.
Figure 5:
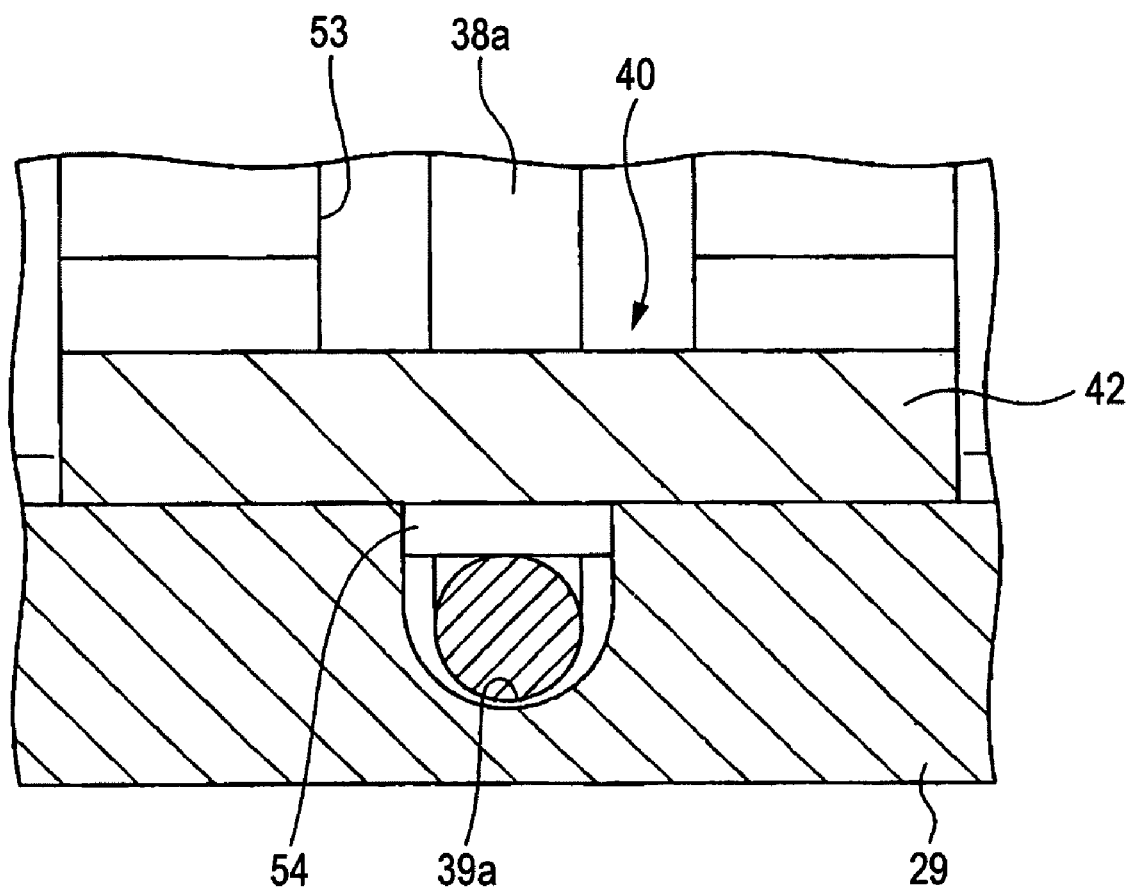
FIG. 5 is an enlarged cross sectional view of welded portions of the electronic component housing unit.

One embodiment of the present invention will now be described while referring to drawings. FIG. 1 is a perspective view of an electronic component housing unit according to the embodiment of the invention. FIG. 2 is an exploded perspective view of the structure of the electronic component housing unit. FIG. 3 is a plan view of an electric wire passing portion, and FIG. 4 is a cross sectional view of the electric wire passing portion. FIG. 5 is an enlarged cross sectional view of a welded portion.

In FIGS. 1 and 2, an electronic component housing unit 2 is depicted that is to be clamped around and secured to an intermediate portion 3 of a length of a well known electric wire 1. The electronic component housing unit 2 includes: a cover member 5, which is assembled with a terminal previously secured to the intermediate portion 3 of the electric wire 1 to form a covered wire assembly 4; and a unit main body 6, which engages the covered wire assembly 4 to establish an electric connection. The unit main body 6 includes a case 7, an electronic component 8, a relay terminal 9, a grounding terminal 10 and a clamp 11. These components will now be described while referring to FIGS. 1 and 5 (the components will be described first, then, the assembly process will be described).

In this embodiment, the electric wire 1 is installed in a vehicle, such as an automobile; however, use of the electric wire 1 is not limited to a vehicle and can be employed for a mechanical construct other than a vehicle. And an electronic component housing unit 2 is to be securely fixed to a predetermined load bearing surface of a vehicle body.

In FIGS. 1 and 2, the electric wire 1 is one of a plurality of wires used to form a wiring harness, and includes an electrical conductor and an insulated coating that covers the electrical conductor. A wire terminal 12 is electrically connected to the intermediate portion 3 of a length of the electric wire 1.

In FIGS. 2 and 3, the wire terminal 12 is made of a conductive metal, and includes: a wire connector 13, which is to be directly connected to the above described electrical conductor; a base portion 14, which is contiguously formed with the wire connector 13; a pair of electric contact portions 16, which are formed upright on either side of the base portion 14 and are to be connected to a first connection portion 15 in the electronic component housing unit 2, which will be described later; a fitting portion 17, which is also formed upright on one side of the base portion 14 and is to be fitted into the cover member 5; a flexible holding member 18, which is formed opposite the fitting portion 17; and a pair of wire holding members 19, which are contiguously formed on either side of the base portion 14 and are caulked to hold the above described insulation coating.

The electric contact portion pair 16 are tab-like portions, and are arranged in parallel, on either side of the electric wire 1, perpendicular to the wire axis and between the wire connector 13 and the pair of electric holding portions 19. A rectangular through hole (not denoted by a reference numeral) used for engagement is formed in the fitting portion 17. The flexible holding portion 18 is provided to press against the internal wall of the cover member 5.

In FIGS. 1 and 2, the cover member 5, which is a synthetic resin insulating member, is formed and positioned for attachment to the wire terminal 12, and includes a ceiling wall 20 and side walls contiguously formed with the ceiling wall 20. The interior portion defined by the side walls is employed as a wire storage portion 21, and the outside surfaces of the side walls (or the side walls themselves) serve as a case insertion guide portion 22 when the cover member 5 is inserted into the case 7.

Furthermore, a pair of notches 23 (only one notch is shown here) are formed in the side walls at locations corresponding to the pair of electric contact portions 16 provided for the wire terminal 12. In addition, flexible, arm-shaped protrusions 24 are formed in the side walls, and a plurality of cover engagement portions 25, having substantial protrusive shapes, are formed and positioned on the side walls to engage like shaped openings when fitted into the case 7.

Wire support portions 26 are formed at either end of the side walls, in the wire axial direction, to sandwich the wire terminal 12. The wire support portions 26 are U-shaped notches that press against and thus support the electric wire 1. (To support the electric wire 1, the direct application of pressure thereto is the preferred method, however, so long as the horizontal state of the electric wire 1 can be maintained when the cover member 5 is attached, another method can be employed. That is, so long as the bending or the oblique insertion of the electric wire 1 can be prevented, any other available support structure is acceptable.)

In FIGS. 1 and 2, the case 7 of the unit main body 6 is a synthetic resin insulation member, and includes: a component storage recessed portion 27; and an engagement connection recessed portion 28, which is adjacent to the component storage recessed portion 27. The component storage recessed portion 27 and the engagement connection recessed portion 28 are enclosed by a bottom wall 29, side walls 30, formed along the edges of the bottom wall 29, and a partition wall 31. The component storage recessed portion 27 is employed as a storage compartment for the electronic component 8, and the engagement connection recessed portion 28 is employed to accept the covered wire assembly 4 used to provide an electrical connection. The component storage recessed portion 27 and the engagement connection recessed portion 28 are separated by the partition wall 31.

As an overall view of the electronic component housing unit 2, the engagement connection recessed portion 28 and the covered wire assembly 4, which is fitted into this portion 28, together provide a wire passing portion 32.

Protrusions 33, and protrusion holders 34 and wire support portions 35 are formed either on or in the side walls 30. The protrusion holders 34 that are provided fit the covered wire assembly 4. It should be noted that the structure of the protrusion holders 34 differs from those in FIG. 1 and in the other diagrams, and an arbitrary structure can be employed.

The wire support portions 35 formed in the engagement connection recessed portion 28 have a U shape, so that when the covered wire assembly 4 is fitted into the engagement connection recessed portion 28, the electric wire 1 is inserted into and held by the wire support portions 35.

A protrusion holder 36 and lead support portions 37a and 37b are formed in the partition wall 31. The protrusion holder 36 is employed to engage the covered wire assembly 4, and the lead support portions 37a and 37b are employed to support leads 38a and 38b, of the electronic component 8 to be accommodated in the component storage recessed portion 27, that are extended into the engagement connection recessed portion 28. The lead support portions 37a and 37b are slit shaped.

In the bottom (the bottom wall 29) of the engagement connection recessed portion 28, lead escape grooves 39a and 39b are formed to accept the leads 38a and 38b of the electronic component 8, which are extended into the engagement connection recessed portion 28 (see FIG. 4). The leads 38a and 38b of the electronic component 8 must be fitted into the lead escape grooves 39a and 39b, so that normal positioning can be performed. If, when the assembly process is shifted to the next process, the leads 38a and 38b have not been inserted into the lead escape grooves 39a and 39b, a portion that constitutes the first connection portion 15 and a second connection portion 40, which will be described later, would be raised by the leads 38a and 38b. According to the arrangement of this embodiment, however, an incomplete assembly can be detected, and destruction of equipment due to welding or distribution of defects can be avoided. Further, although not especially illustrated, paired ribs (ribs used to position the lead 38b and the relay terminal 9) may be projected along both sides of the lead escape groove 39b. Furthermore, the ribs should be located along both sides of the position in FIG. 3 through which the lead 38b is extended. When these ribs are formed on the bottom, positioning of the lead 38b and the relay terminal 9 can be performed simultaneously.

On the bottom (the bottom wall 29) of the engagement connection recessed portion 28, relative to the relay terminal 9 that constitutes the first connection portion 15, a fixed portion 41 is formed. In addition to the relay terminal 9, the first connection portion 15 includes the lead 38b, which is rendered conductive by being welded to the relay terminal 9.

The second connection portion 40 includes: a connection leg 42 of the grounding terminal 10; and the lead 38a that is rendered conductive by being welded to the connection leg 42.

Referring to FIG. 2, the relay terminal 9 of the first connection portion 15 is made of a conductive metal, and includes: a fixed base portion 43 shaped like a bus bar; a pair of upright spring contacts 44, which are formed on the sides of the fixed base portion 43 and which contact the electric contact portions 16 of the wire terminal 12; and engagement control portions 45 having gate shapes that enclose respective spring contacts 44.

The fixed base portion 43 is formed so that it is securely mounted on the bottom (the bottom wall 29) of the engagement connection recessed portion 28. The fixed base portion 43 includes a plurality of fixed pawls 46, which hook the bottom (the bottom wall 29) of the engagement connection recessed portion 28 to prevent the relay terminal 9 from falling off; and a convex welding portion 47, which contacts the lead 38b that is inserted into the lead escape groove 39b.

The spring contacts 44 flexibly contact the wire terminal 12. Therefore, in this embodiment, the spring contacts 44 are provided as dogleg shaped arms, so that their convex surfaces face each other. The engagement control portions 45 control the engagement of the covered wire assembly 4, consonant with the longitudinal direction of the cover member 5, and also protect the spring contacts 44. The distal ends of the engagement control portions 45 are bent outward so they engage and hold the upper, opposite edges of the longitudinal opening of the engagement connection recessed portion 28.

In FIGS. 1 and 2, the grounding terminal 10 is made of a conductive metal, and includes: an earth portion 49, in which a screw through hole 48 is formed; a base portion 50, which is formed to provide a cover for hiding the opening of the component storage recessed portion 27; and the connection leg 42, which is contiguously formed with the base portion 50 and constitutes the second connection portion 40. In this embodiment, the earth portion 49 is located at a distance from the wire passing portion 32 (see FIG. 1).

As described above, the base portion 50 serves as a cover, and includes: engagement portions 51, which are to be engaged by the protrusions 33 of the case 7; and a clamp detachment portion 52, in which to mount the clamp 11 that is inserted into and held on the load bearing surface of a vehicle body. The base portion 50 has a shape such that the electronic component 8, fitted in the component storage recessed portion 27, can be pressed down.

The engagement portions 51, formed like frames, are bent down from the sides of the base portion 50, and are sufficiently flexible to rise and ride across the protrusions 33 on the case 7. Since the clamp detachment portion 52 is formed to pass through the base portion 50, a slide fixing portion (not shown) of the clamp 11 is to be inserted through the detachment portion 52 and to be slid in a predetermined direction to fix the clamp 11.

The connection leg 42 is a portion that is to be inserted into the engagement connection recessed portion 28 to constitute the second connection portion 40, and is formed by bending a strip portion into an L shape. A slit 53 is then formed in the L-shaped portion of the connection leg 42 to avoid the lead 38a of the electronic component 8. Further, a convex welding portion 54 is formed on a portion corresponding to the bottom (the bottom wall 29) of the engagement connection recessed portion 28, and contacts the lead 38a that is inserted into the lead escape groove 39a.

In FIGS. 1 and 2, the clamp 11 is a synthetic resin member that is detachable from the grounding terminal 10, and that is to be inserted into and held by the load bearing face of a vehicle body. The clamp 11 is prepared as a member corresponding to a fitting portion, as described in the claims of this invention. The clamp 11 includes: a base plate 55, which is mounted on the base portion 50 of the grounding terminal 10; a slide fixing portion (not shown), which is formed on the reverse face of the base plate 55 and is to be fixed to the clamp detachment portion 52 of the grounding terminal 10; a strut 56, which is provided on the obverse face of the base plate 55; a pair of flexible fitting portion blades 57, which are connected to the strut 56; and a pair of flexible load bearing face pressing portions 58, which are connected to the base plate 55.

The fitting portion blades 57 are inserted into a clamp hole formed in the load bearing face of the vehicle body and the ends of the individual fitting portion blades 57 are engaged and held by the edges of the opening in the clamp hole, and the load bearing face pressing portions 58 are pressed against the load bearing face. As a result, the clamp 11 is fully engaged. It should be noted that a fitting portion 59 controls the distance the fitting portion blades 57 are inserted.

In FIG. 2, the electronic component 8 includes a main body 60 and the pair of leads 38a and 38b. In this embodiment, a conventional capacitor that serves as a noise filter is employed as the electronic component 8; however, a diode or a resistor may be employed, consonant with other applications.

Next, based on this arrangement, explanations will be given for a process used to assemble the covered wire assembly 4, a process used to assemble the unit main body 6, a process used to assemble the electronic component housing unit 2 and a process used to mount the electronic component housing unit 2.

During the process for forming the covered wire assembly 4, first, the coating is removed from a predetermined location in the intermediate portion 3 of a length of electric wire 1 to expose a pre-established contact range of the conductor. Then, the wire terminal 12 is connected to the exposed conductor and the cover member 5 is attached to the electric wire 1 to hide the wire terminal 12. Thus, the forming of the covered wire assembly 4 is completed. It should be noted that the advance preparation is always performed for the covered wire assembly 4.

When the forming of the covered wire assembly 4 has been completed, the electric contact portions 16 of the wire terminal 12 are exposed through the notches 23 in the cover member 5. Further, the fitting portion 17 of the wire terminal 12 is positioned and held by the protrusions 24 in the cover member 5. The wire terminal 12 is stored in the wire storage unit 21 of the cover member 5 and is protected by the cover member 5, and the electric wire 1 is held down by the wire support members 26 of the cover member 5. Thus, in the completed state, the covered wire assembly 4 maintains the horizontal state of the electric wire 1.

During the process employed to assemble the unit main body 6, first, to position the electronic component 8, the main body 60 is stored in the component storage recessed portion 27 of the case 7, while intermediate portions of the electronic component 8 leads 38a and 38b are inserted into the lead support portions 37a and 37b and the distal ends of the leads 38a and 38b are inserted into the lead escape grooves 39a and 39b in the engagement connection recessed portion 28. Sequentially, the relay terminal 9 and the connection leg 42 of the grounding terminal 10 are arranged at pre-designated locations in the engagement connection recessed portion 28 (see FIG. 3). In this process, when the grounding terminal 10 is fitted into the case 7, the base portion 50 hides the electronic component storage recessed portion 27 wherein the main body 60 of the electronic component 8 is stored. Following this, welding is performed at the relay terminal 9 and the connection leg 42 to respectively secure the leads 38a and 38b to the convex welding portions 54 and 47. As a result, the first connection portion 15 and the second connection portion 40 are obtained (see FIGS. 4 and 5), and the assembly of the unit main body 6 is completed.

The process employed to assemble the electronic component housing unit 2 is performed after the assembly of the covered wire assembly 4 and of the unit main body 6 have been completed. During this process, the covered wire assembly 4 is fitted into the engagement connection recessed portion 28 of the unit main body 6, simultaneously establishing an electric connection. Thus, the assembly of the electronic component housing unit 2 is completed (the wire passing portion 32 is obtained).

Since the covered wire assembly 4 is prepared in advance and the covered wire assembly 4 need only be fitted into the engagement connection recessed portion 28 of the main body 6, the electronic component housing unit 2 can be easily assembled. When the covered wire assembly 4 has been inserted and is being fitted into the engagement connection recessed portion 28, the case insertion guide portion 22 is employed to smoothly guide the cover member 5 until fully fitted in the engagement connection recessed portion 28 and the process is halted. When the fitting of the covered wire assembly 4 in the engagement connection recessed portion 28 has been completed, the electric wire 1 is fully supported by the wire support portions 35 of the case 7.

During the process performed to mount the electronic component housing unit 2 in a vehicle, first, the electronic component housing unit 2 is temporarily mounted by inserting the clamp 11 into a clamp hole that is formed in the load bearing face of the vehicle body. Then, the screw through hole 48 in the grounding terminal 10 is aligned with a screw hole formed in the load bearing face, and a screw is inserted in the holes and is driven and tightened to secure the earth portion 49 of the grounding terminal 10 to the load bearing face. It should be noted that rotational torque generated by tightening the screw is absorbed by the clamp 11 that is directly secured to the grounding terminal 10. When the earth portion 49 of the grounding terminal 10 has been secured, the attachment of the electronic component housing unit 2 is completed.

As described while referring to FIGS. 1 to 5, according to the present invention, since the clamp 11 is directly secured to the grounding terminal 10, the electronic component housing unit bearing the grounding terminal 10 is prevented from turning and stress is not transmitted to the case 7 and other constituents. Thus, according to the present invention, the occurrence of deformation, which is a conventional problem, can be avoided.

Of course, the present invention can be variously modified without departing from the subject of the invention.

What is claimed is:

1. An electronic component housing unit, comprising:
   a case accommodating an electronic component and at least a part of an electric wire;
   a grounding terminal; including,
      a base portion attached to the case;
      an earth portion continued from the base portion and to be attached to an external object on which the electronic component housing unit is to be mounted; and
      a fitting portion to be fitted to the external object, wherein the fitting portion is detachably and directly secured to the base portion.

2. The electronic component housing unit according to claim 1, wherein: the case has an opening; and
   the base portion is formed so as to so as to cover at least a part of the opening for the electronic component accommodated in the case.

3. The electronic component housing unit according to claim 1, wherein the fitting portion is formed of resin and the ground terminal is formed of conductive metal.

4. The electronic component housing unit according to claim 1, wherein the fitting portion is a clamp comprising load bearing face pressing portions, which press against a load bearing face of the external object when the electronic component housing unit is mounted to the external object.

5. The electronic component housing unit according to claim 1, wherein the earth portion includes a screw hole for accepting a screw capable of attaching the earth portion to the external object, and the fitting portion absorbs a rotational torque generated when the screw is tightened to the external object.

* * * * *